(12) United States Patent
Nagaoka (10) Patent No.: US 6,400,597 B1
(45) Date of Patent: Jun. 4, 2002

(54) SEMICONDUCTOR MEMORY DEVICE

(75) Inventor: Hideaki Nagaoka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/760,802

(22) Filed: Jan. 17, 2001

(30) Foreign Application Priority Data

Aug. 29, 2000 (JP) ........................................ 2000-259669

(51) Int. Cl.[7] ................................................ G11C 5/06
(52) U.S. Cl. .................... 365/63; 365/189.08; 365/231; 365/230.08
(58) Field of Search ....................... 365/189.01, 189.08, 365/200, 230.06, 230.08, 230.03, 231, 63

(56) References Cited

U.S. PATENT DOCUMENTS 5,691,946 A * 11/1997 DeBrosse et al. ........... 365/200
6,041,006 A * 3/2000 Tsuchiya .................... 365/210

FOREIGN PATENT DOCUMENTS

JP 4-121896 4/1992
JP 10-83672 3/1998

* cited by examiner

Primary Examiner—David Nelms
Assistant Examiner—Gene N. Auduong
(74) Attorney, Agent, or Firm—Burns, Doane, Swecker & Mathis, LLP (57) ABSTRACT

The number of apparently independently operating memory sets can be changed by providing the same number of address setting circuits as that of memory cell arrays. Since the number of mounted address setting circuits increases compared with a case where the number of memory sets is fixed, the problem arises that the layout area in a semiconductor memory device increases. However, by providing a switching circuit for switching the correspondence relationship between memory cell arrays and address setting circuits in response to a signal selecting the number of memory sets, a semiconductor memory device capable of changing the number of memory sets which seemingly independently operate without providing the same number of address setting circuits as that of memory cell arrays.

8 Claims, 9 Drawing Sheets

SEMICONDUCTOR MEMORY DEVICE

BACKGROUND OF THE INVENTION

1. Field of the Invention

The present invention relates to a semiconductor memory device capable of changing the number of memory sets.

2. Description of Related Art

Figure 8:
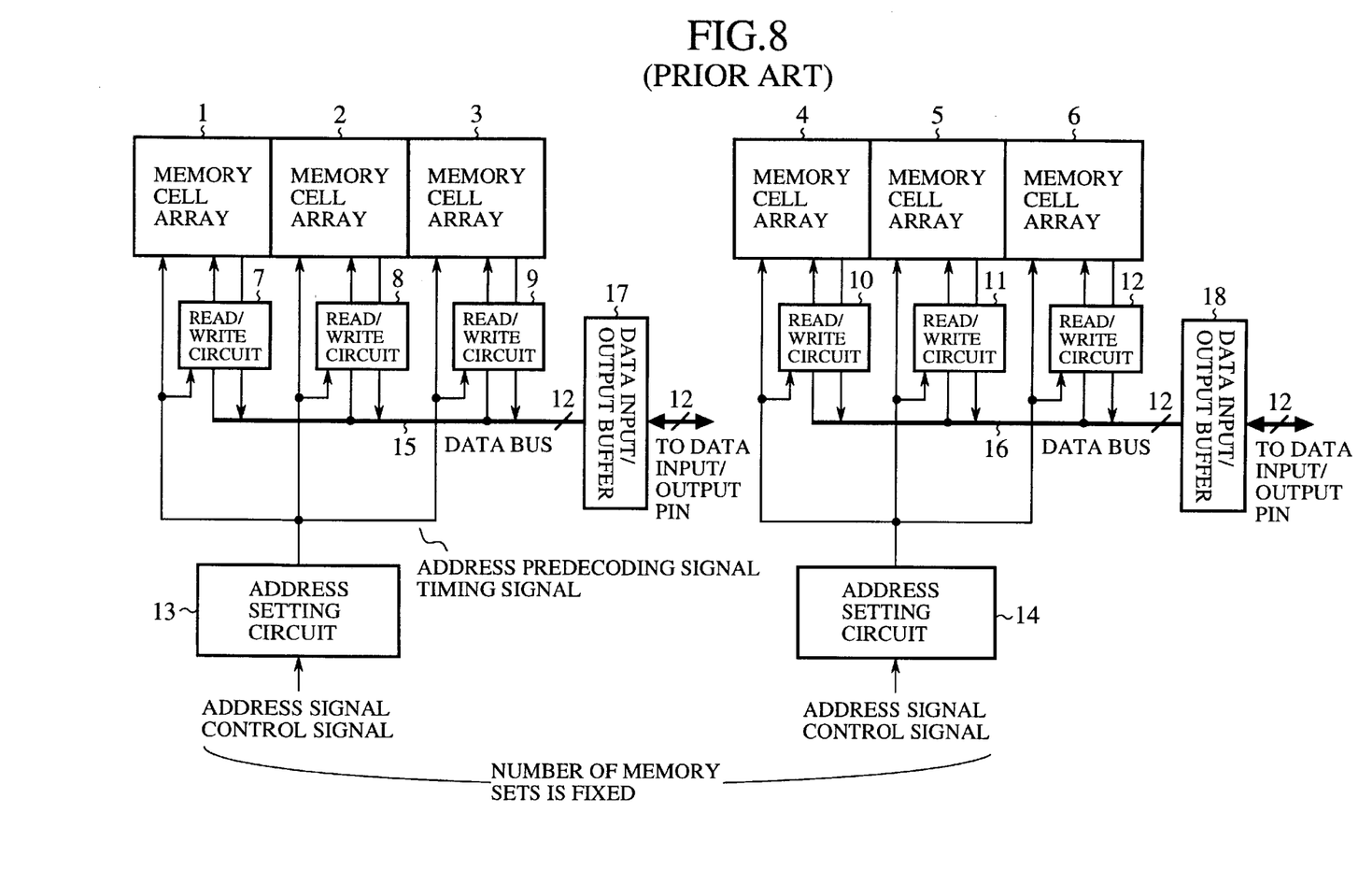
FIG. 8 is a block diagram showing a conventional semiconductor memory device.

FIG. 8 is a block diagram showing a conventional semiconductor memory device. In the figure, the reference numerals 1 to 6 designate memory cell arrays; and the reference numerals 7 to 12 designate read/write circuits connected to the memory cell arrays 1 to 6, respectively, which perform read/write of data for the memory cell arrays. Each read/write circuit 7 to 12 is composed of a write driver for writing data and a sense amplifier for reading data.

The reference numerals 13 and 14 designate address setting circuits which set an address and output a timing signal for reading/writing of the read/write circuits 7 to 9 and 10 to 12. Each address setting circuit 13 and 14 is composed of an address predecoder for setting an address in response to an address signal and outputting an address predecoding signal, an address buffer for storing the set address and a timing generator for outputting a timing signal according to a control signal.

The reference numerals 15 and 16 designate data buses and the reference numerals 17 and 18 designate data input/output buffers which hold data to be written into the memory cell arrays 1 to 3 and 4 to 6 or data read therefrom.

Next, the operation of the conventional semiconductor memory device will be described.

In the semiconductor memory device of FIG. 8, the number of independently operating memory sets in the same chip is two and cannot be changed. In other words, the memory cell arrays 1 to 3 constitute a first memory set, whereas the memory cell arrays 4 to 6 constitute the second memory set.

Thus, two "3 Mbit 12IO memory" sets are provided in the semiconductor memory device of FIG. 8.

Figure 9:
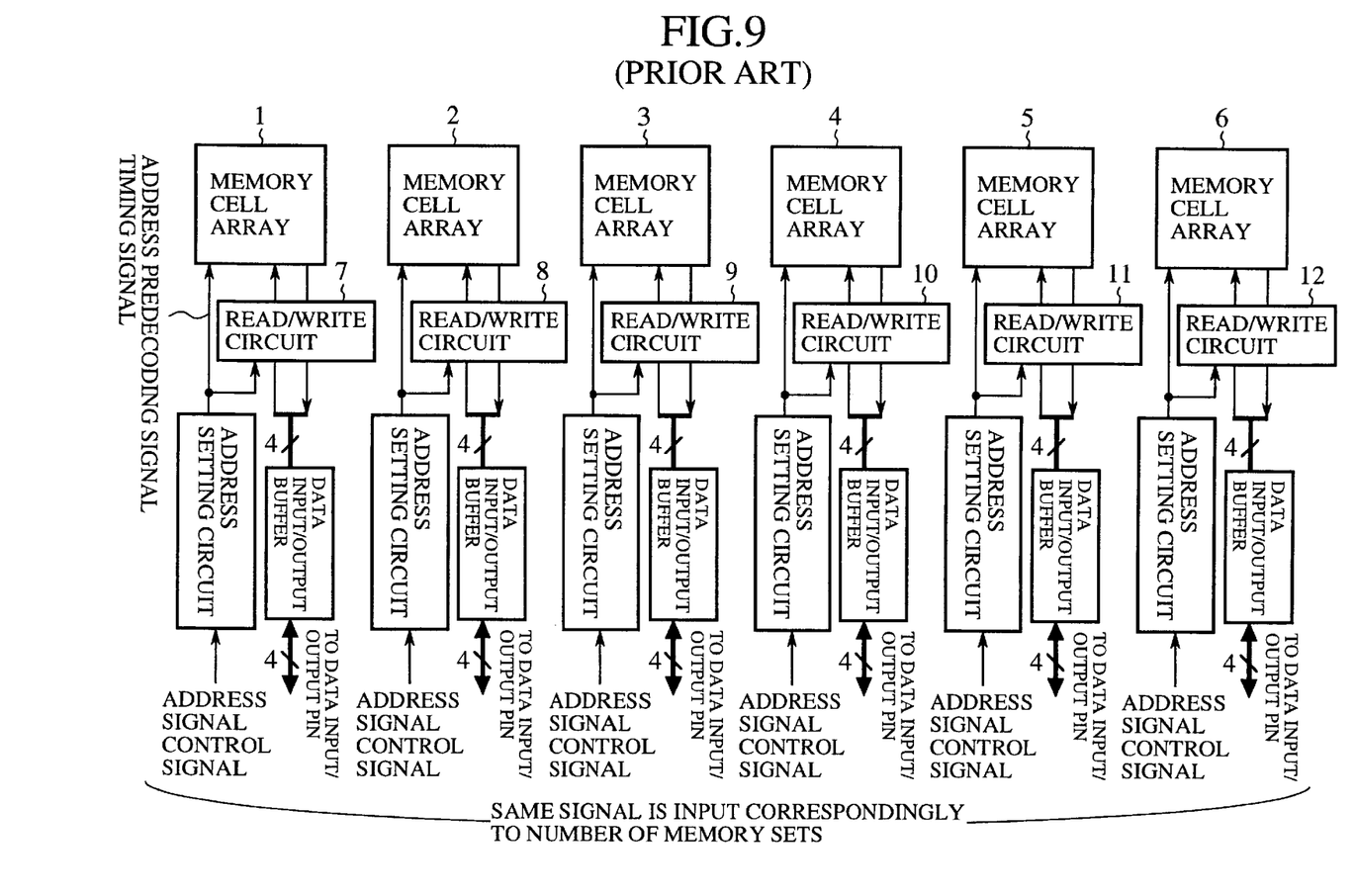
FIG. 9 is a block diagram showing a conventional semiconductor memory device.

Although the number of independently operating memory sets in the same chip is fixed to two in the above-mentioned semiconductor memory device, the number of seemingly independently operating memory sets can be changed in a semiconductor memory device as shown in FIG. 9.

In the semiconductor memory device of FIG. 9, the same number of address setting circuits as that of memory cell arrays are provided so that each of t he memory cell arrays can independently operate.

In the conventional semiconductor memory device thus constructed, if address setting circuits whose number is the same as that of memory cell arrays are provided, the number of seemingly independently operating memory sets can be changed. However, the number of mounted address setting circuits increases compared with a case where the number of memory sets is fixed, resulting in an increase in the layout area of a semiconductor memory device.

SUMMARY OF THE INVENTION

The present invention is implemented to solve the above problems in the conventional semiconductor memory device. An object of the present invention is to provide a semiconductor memory device capable of changing the number of memory sets which seemingly independently operate without providing the same number of address setting circuits as that of memory cell arrays.

According to the present invention, there is provided a semiconductor memory device comprising; a plurality of memory cell arrays constituting a plurality of memory sets; a plurality read/write circuits, connected to the memory cell arrays, respectively, for performing read/write of data for the memory cell arrays; a plurality of address setting circuits for setting an address for reading/writing of the read/write circuits, a number of the address setting circuits being a maximum number of the memory sets; and switching means for switching a correspondence relationship between the memory cell arrays and the address setting circuits in response to a signal selecting a number of memory sets.

Here, the semiconductor memory device may further comprise; a data input/output buffer for holding data; and a data bus controller for controlling a connection relationship between a plurality of data buses connecting the read/write circuits to the data input/output buffer.

At a time of switching the correspondence relationship between the memory cell arrays and the address setting circuits, the switching means may disconnect a part of the memory cell arrays from a address setting circuit, if a required memory capacity can be obtained without activating all the memory cell arrays.

If a defect occurs in a memory cell array in use, the switching means may disconnect the defective memory cell array from an address setting circuit and connect another memory cell array which has been disconnected from the address setting circuit to the address setting circuit.

At a time of switching the correspondence relationship between the memory cell arrays and the address setting circuits, the switching means can change a capacity of each of the memory sets composed of at least one memory cell array.

The semiconductor memory device may further comprise a special pad pin for inputting the signal selecting the number of memory sets from an outside.

The semiconductor memory device may further comprise a special pad for inputting the signal selecting the number of memory sets, the pad being connected to a power supply or ground at a time of bonding.

The semiconductor memory device may further comprise a signal wiring for inputting the signal selecting the number of memory sets, the signal wiring being connected to a power supply or ground in a wafer process.

As stated above, according to the present invention, a semiconductor memory device is constructed so as to comprise switching means for switching a correspondence relationship between memory cell arrays and address setting circuits in response to a signal selecting a number of memory sets. Thus, the number of the memory sets which seemingly independently operate without providing the same number of address setting circuits as that of memory cell arrays.

According to the present invention, a semiconductor memory device is constructed so as to further comprise a data bus controller for controlling a connection relationship between a plurality of data buses connecting read/write circuits to a data input/output buffer. Thus, the IO number for use can be changed.

According to the present invention, a semiconductor memory device is constructed such that at a time of switching the correspondence relationship between memory cell arrays and address setting circuits, switching means can disconnect a part of the memory cell arrays from a address setting circuit, if a required memory capacity can be obtained without activating all the memory cell arrays. Thus, power consumption can be reduced.

According to the present invention, a semiconductor memory device is constructed such that if a defect occurs in a memory cell array in use, switching means disconnects the defective memory cell array from an address setting circuit and connects another memory cell array which has been disconnected from the address setting circuit to the address setting circuit. Thus, the yield of the semiconductor memory device can be increased.

According to the present invention, a semiconductor memory device is constructed such that at a time of switching the correspondence relationship between memory cell arrays and address setting circuits, switching means can change a capacity of each of memory sets composed of at least one memory cell array. Thus, the semiconductor memory device can be widely used for various applications.

According to the present invention, a semiconductor memory device is constructed so as to further comprise a special pad pin for inputting the signal selecting the number of memory sets from an outside. Thus, the semiconductor memory device can be used in a plurality of ways.

According to the present invention, a semiconductor memory device is constructed so as to further comprise a special pad for inputting the signal selecting the number of memory sets, the pad being connected to a power supply or ground at a time of bonding. Thus, cost savings can be realized.

According to the present invention, a semiconductor memory device is constructed so as to further comprise a signal wiring for inputting the signal selecting the number of memory sets, the signal wiring being connected to a power supply or ground in a wafer process. Thus, the later processes can be simplified.

DETAILED DESCRIPTION OF THE PREFERRED EMBODIMENTS

An embodiment of the invention will be described.

Embodiment 1

Figure 1:
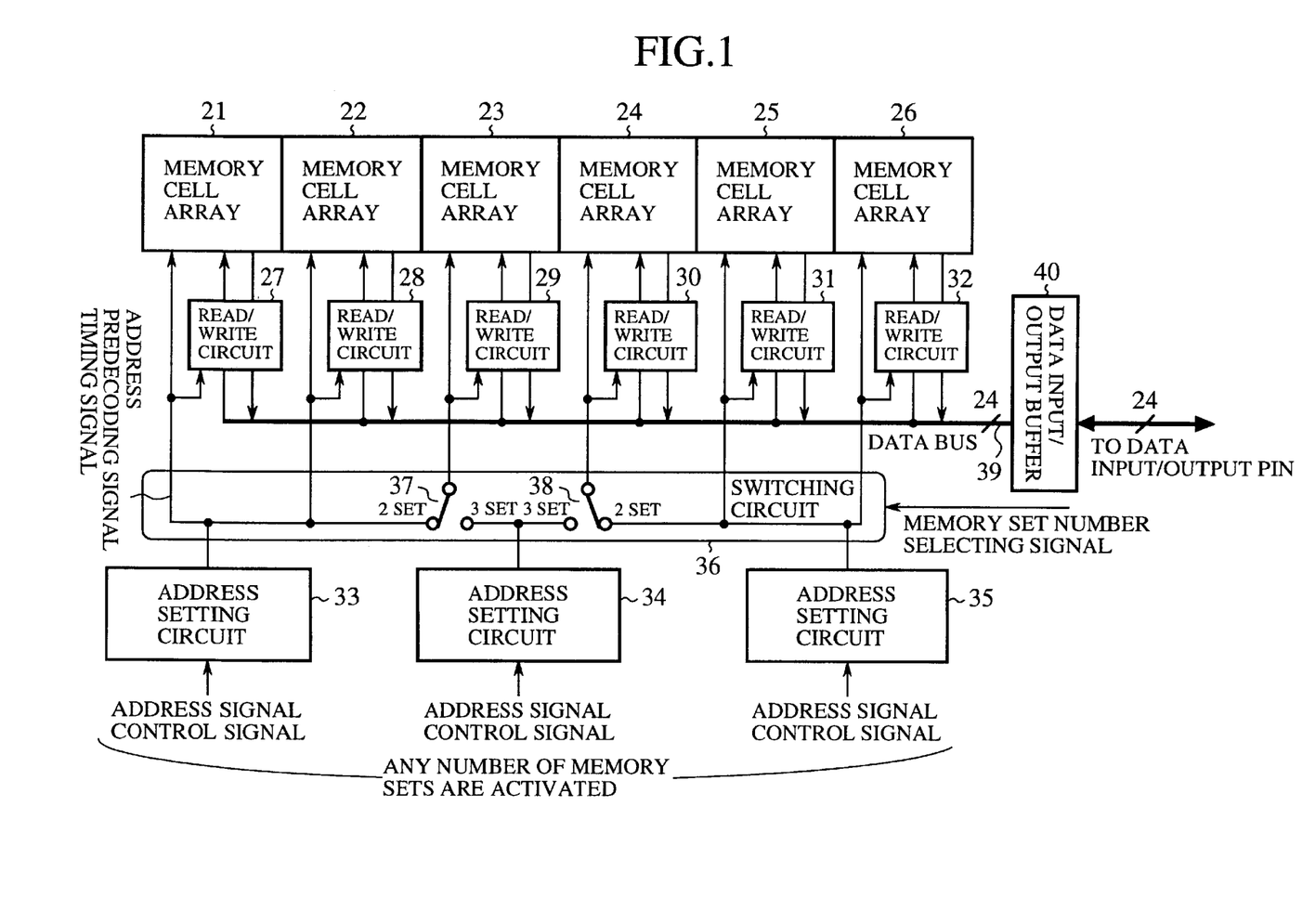
FIG. 1 is a block diagram showing a semiconductor memory device according to the embodiment 1 of the present invention.

FIG. 1 is a block diagram showing a semiconductor memory device according to the embodiment 1 of the present invention. In the figure, the reference numerals 21 to 26 designate memory cell arrays; and the reference numerals 27 to 32 designate read/write circuits connected to the memory cell arrays 21 to 26, respectively, which perform read/write of data for the memory cell arrays. The read/write circuits 27 to 32 each are composed of a write driver for writing data and a sense amplifier for reading data.

The reference numerals 33 to 35 designate address setting circuits which set an address for reading/writing of the read/write circuits 27 to 32. Each address setting circuit 33 to 35 is composed of an address predecoder for setting an address in response to an address signal and outputting an address predecoding signal, an address buffer for judging the set address and a timing generator for outputting a timing signal according to a control signal or an address signal.

The reference numeral 36 designates a switching circuit (switching means) which switches the correspondence relationship between the memory cell arrays 21 to 26 and the address setting circuit 33 to 35 in response to a memory set number selecting signal; 37 and 38 designate switches constituting the switching circuit 36; 39 designates a data bus; and 40 designates a data input/output buffer which holds data to be written into the memory cell arrays 21 to 26 or data read therefrom.

Next, the operation of the semiconductor memory device will be described.

In the semiconductor memory device of FIG. 1, the total memory capacity is 6 Mbit and the total IO number is 24, allowing both "256K word×8IO×3 sets" and "256K word× 12IO×2 sets".

The same number of address setting circuits as the maximum number of memory sets are provided. In the embodiment 1, since the maximum number of memory sets is three, three address setting circuits are provided.

In a mode of "256K word×8IO×3 sets", a memory set number selecting signal corresponding to the mode is input to the switching circuit 36.

Upon receiving the memory set number selecting signal, the switching circuit 36 closes the switches 37 and 38 toward three-set sides.

As a result, the address setting circuit 33 is connected to the memory cell arrays 21 and 22 (memory capacity: 256K word×8IO=2 Mbit), the address setting circuit 34 is connected to the memory cell arrays 23 and 24 (memory capacity: 256K word×8IO=2 Mbit), and the address setting circuit 35 is connected to the memory cell arrays 25 and 26 (memory capacity: 256K word×8IO=2 Mbit) so-that the three memory sets (memory capacity: 256K word×8IO×3 sets=6 Mbit) can independently operate as a whole.

On the other hand, in a mode of "256K word×12IO×2 sets", a memory set number selecting signal corresponding to the mode is input to the switching circuit 36.

Upon receiving the memory set number selecting signal, the switching circuit 36 closes the switches 37 and 38 toward two-set sides.

As a result, the address setting circuit 33. is connected to the memory cell arrays 21, 22 and 23 (memory capacity: 256K word×12IO=3 Mbit), and the address setting circuit 35 is connected b the memory cell arrays 24, 25 and 26 (memory capacity: 256K word×12IO=3 Mbit) so that the two memory sets (memory capacity: 256K word×12IO×2 sets 6 Mbit) can independently operate as a whole. In this case, the address setting circuit 34 is inactive.

As stated above, according to the embodiment 1, since the switching circuit 36 changes the correspondence relationship between the memory cell arrays 21 to 26 and the address setting circuit 33 to 35 in response to memory set number selection signals, the number of memory sets which seemingly independently operate without providing the same number of address setting circuits as that of memory cell arrays.

The embodiment 1 has showed the cases of "256K word×8IO×3 sets" and "256K word×12IO×2 sets". Further, in a semiconductor memory device where the total memory capacity is 6 Mbit and the total IO number is 24, the following constructions other than the above constructions are enabled by properly locating switches of a switching circuit 36 and address setting circuits;

256K word×4IO×6 sets
256K word×6IO×4 sets
256K word×24IO×1 sets

Figure 2:
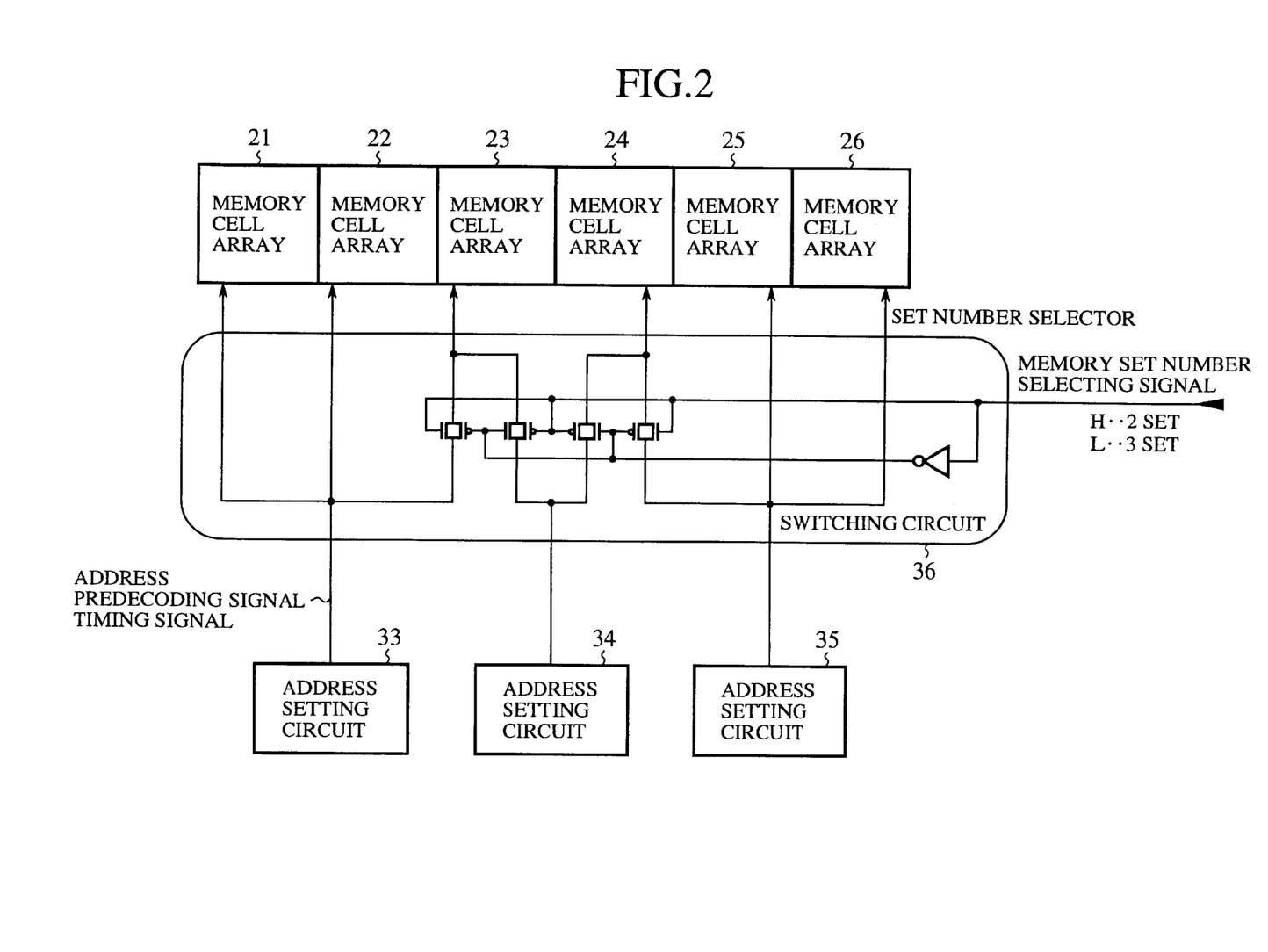
FIG. 2 is a block diagram showing an example of an switching circuit.

Further, although the switching circuit 36 is composed of the switches 37 and 38 in the embodiment 1, it is not limited thereto and may be composed of multiplexers as shown in FIG. 2 (the read/write circuits 27 to 32 and the data input/output buffer 40 are omitted). In the example of FIG. 2, when a memory set number selecting signal is at a H level, the mode of "256K word×12IO×2 sets" is selected, while when a memory set number selecting signal is at a L level, the mode of "256K word×8IO×3 sets" is selected.

Embodiment 2

Figure 3:
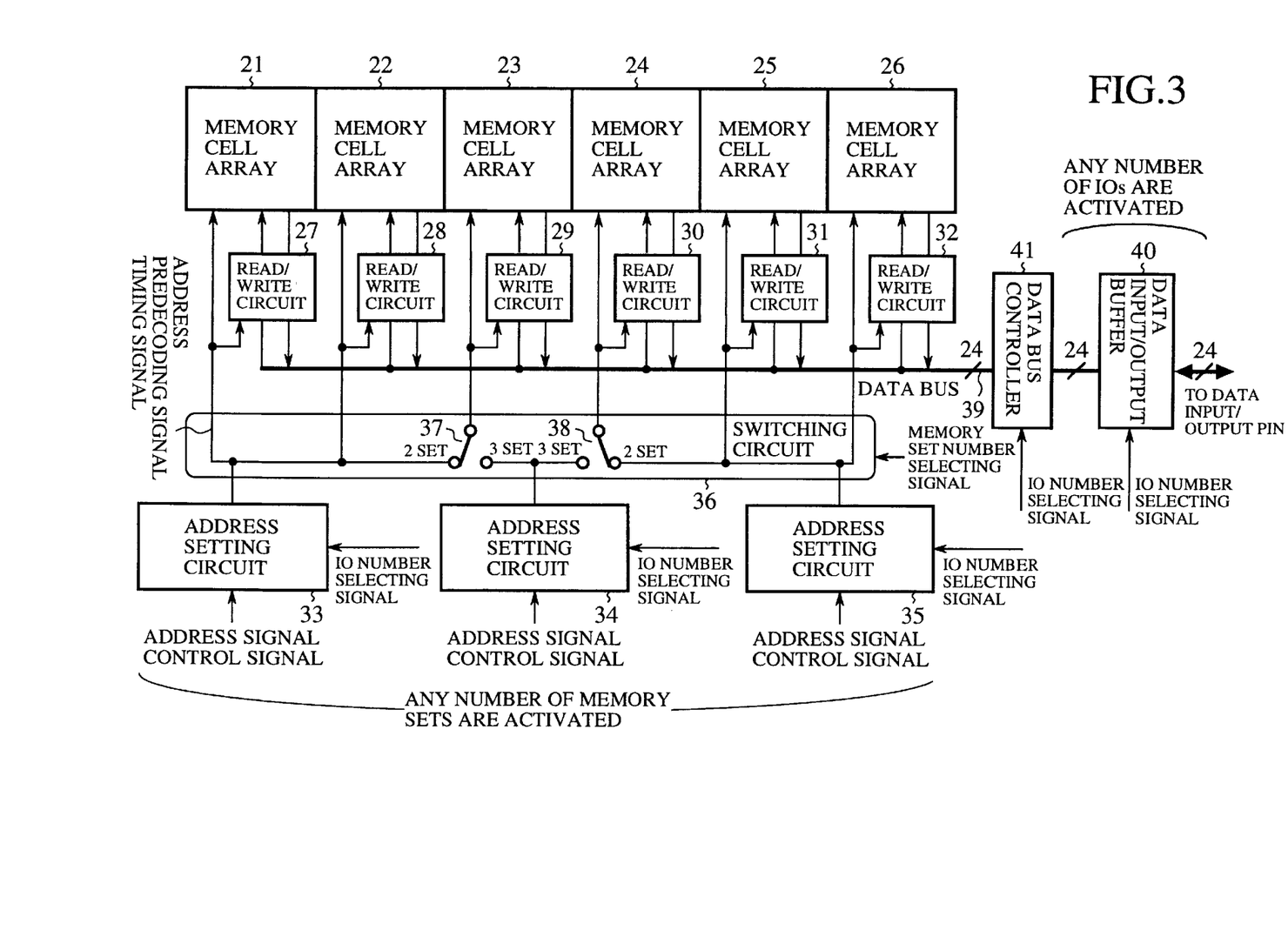
FIG. 3 is a block diagram showing a semiconductor memory device according to the embodiment 2 of the present invention.

FIG. 3 is a block diagram showing a semiconductor memory device according to the embodiment 2 of the present invention. In this figure, like reference numerals of FIG. 1 denote like or corresponding constituent elements thereof and detail explanation therefor is omitted.

The reference numeral 41 designates a data bus controller which controls the connection relationship between a plurality of data bus signal lines constituting a data bus 39.

Next, the operation of the semiconductor memory device will be described.

Although the total IO number is 24 in the above embodiment 1, the IO number for use can be changed.

Figure 4:
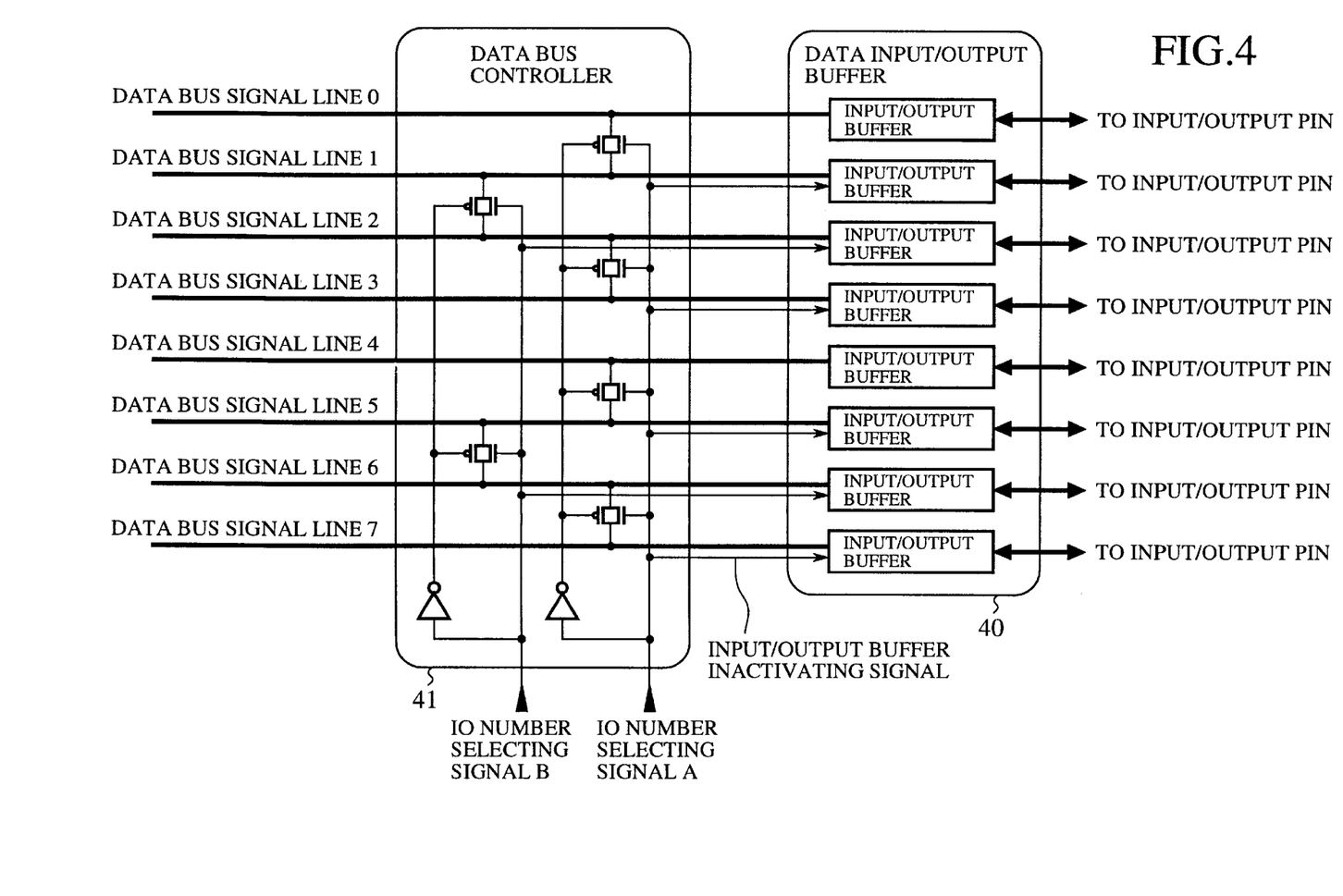
FIG. 4 is a block diagram showing an example of a data bus controller.

Specifically, as shown in FIG. 4, the data bus controller 41 controls inner multiplexers to control connection/disconnection between data bus signal lines 0 and 1, connection/disconnection between data bus signal lines 2 and 3, connection/disconnection between data bus signal lines 4 and 5, connection/disconnection between data bus signal lines 6 and 7, connection/disconnection between data bus signal lines 1 and 2, and connection/disconnection between data bus signal lines 5 and 6. Although FIG. 4 shows only 8 data bus signal lines for simplicity, in practice, there are 24 data bus signal lines.

In a case where both IO number selecting signals A and B are at a L level, the data bus signal lines 0 to 7 are not connected to each other and isolated so that the IO number for use is 24.

In a case where the IO number selecting signal A is at a H level and the IO number selecting signal B is at a L level, the data bus signal lines 0 to 7 are paired two by two (for example, the data bus signal line 0 is connected to the data bus signal line 1) so that the IO number for use is 12 and 12 of 24 data input/output buffers are inactive.

In a case where both the IO. number selecting signals A and B are at a H level, the data bus signal lines 0 to 7 are paired four by four. (for example, the data bus signal lines 0, 1, 2 and 3 are connected) so that the IO number for use is 6 and 18 of 24 data input/output buffers are inactive.

The embodiment 2 has showed the cases of the "256K word ×8IO×3 sets" and "256K word×12IO×2 sets". However, in a case where the total memory capacity is 6 Mbit and the total IO number may be changed, the following constructions are enabled;

when using the data bus signal lines which are all isolated,
256K word×4IO×6 sets
256K word×6IO×4 sets
256K word×8IO×3 sets
256K word×12IO×2 sets
256K word×24IO×1 sets when using the data bus signal lines which are paired two by two,
512K word×2IO×6 sets
512K word×3IO×4 sets
512K word×4IO×3 sets
512K word×6IO×2 sets
512K word×12IO×1 sets when using the data bus signal lines which are paired four by four,
1M word×1IO×6 sets
1M word×2IO×3 sets
1M word×3IO×2 sets
1M word×6IO×1 sets Embodiment 3

Figure 5:
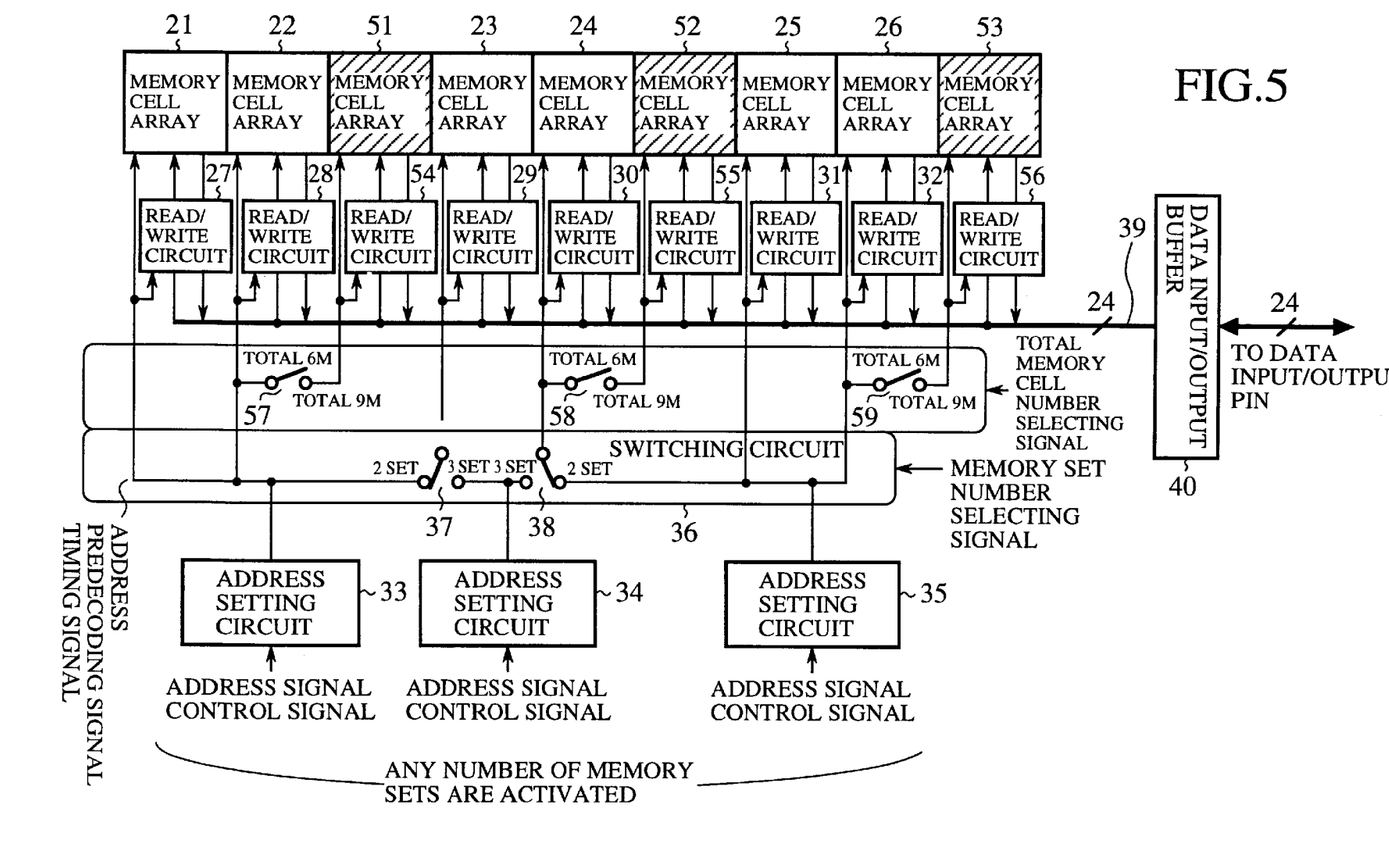
FIG. 5 is a block diagram showing a semiconductor memory device according to the embodiment 3 of the present invention.

FIG. 5 is a block diagram showing a semiconductor memory device according to the embodiment 3 of the present invention. In this figure, like reference numerals of FIG. 1 denote like or corresponding constituent elements thereof and detail explanation therefor is omitted.

The reference numerals 51 to 53 designate memory cell arrays; 54 to 56 designate read/write circuits; and 57 to 59 designate switches constituting a switching circuit 36.

Next, the operation of the semiconductor memory device will be described.

Although all the memory cell arrays are used in the above embodiments 1 and 2, a part of the memory cell arrays may be disconnected from address setting circuits if a required memory capacity can be obtained without activating all the memory cell arrays.

Specifically, in a case where a total required memory capacity of all memory sets is 6 Mbit, if the switching circuit 36 changes the switches 57 to 59 to 6 M sides, the memory cell arrays 51, 52 and 53 are disconnected from address setting circuits 33, 34 and 35 so that the memory cell arrays 51, 52 and 53 are inactivated. As a result, this construction becomes similar to that of the embodiment 1.

On the other hand, in a case where a total required memory capacity of all memory sets is 9 Mbit, if the switching circuit 36 changes the switches 57 to 59 to 9 M sides, memory cell arrays 51, 52 and 53 are connected to the address setting circuits 33, 34 and 35 so that the memory cell arrays 51, 52 and 53 are activated. In this case, "256K word×12IO×3 sets" and "256K word×18IO×2 sets" are enabled.

Embodiment 4

Figure 6:
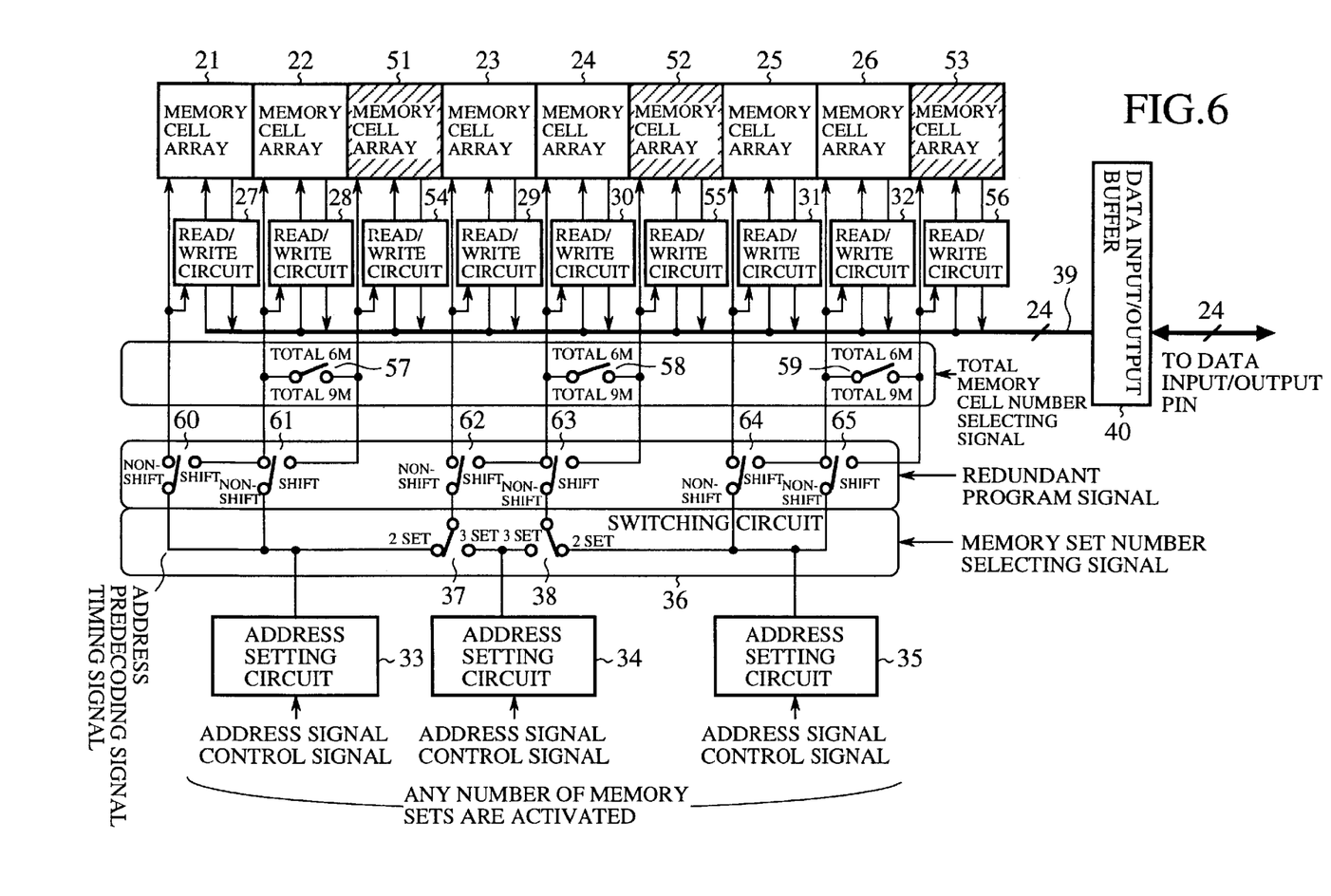
FIG. 6 is a block diagram showing a semiconductor memory device according to the embodiment 4 of the present invention.

FIG. 6 is a block diagram showing a semiconductor memory device according to the embodiment 4 of the present invention. In this figure, like reference numerals of FIG. 5 denote like or corresponding constituent elements thereof and detail explanation therefor is omitted.

The reference numerals 60 to 65 designate switches constituting a switching circuit 36.

Next, the operation of the semiconductor memory device will be described.

The above embodiment 3 has showed a semiconductor memory device where a part of memory cell arrays can be disconnected from address setting circuits, if a required memory capacity can be obtained without-activating all the memory cell arrays. In such a case where memory cell-arrays 51 to 53 are inactive, if a defect occurs in a memory cell array in use, the defective memory cell array may be disconnected from an address setting circuit and any one of the inactive memory cell arrays 51 to 53 may be connected to the address setting circuit.

For example, in a case where a memory cell array 21 is defective, the switching circuit 36 changes the switches 60 and 61 to shift sides so that the memory cell array 21 is shifted to the adjacent memory cell array 22 and the memory cell array 22 is shifted to the adjacent memory cell array 51.

Thus, the yield of semiconductor memory devices can be increased.

Embodiment 5

Figure 7:
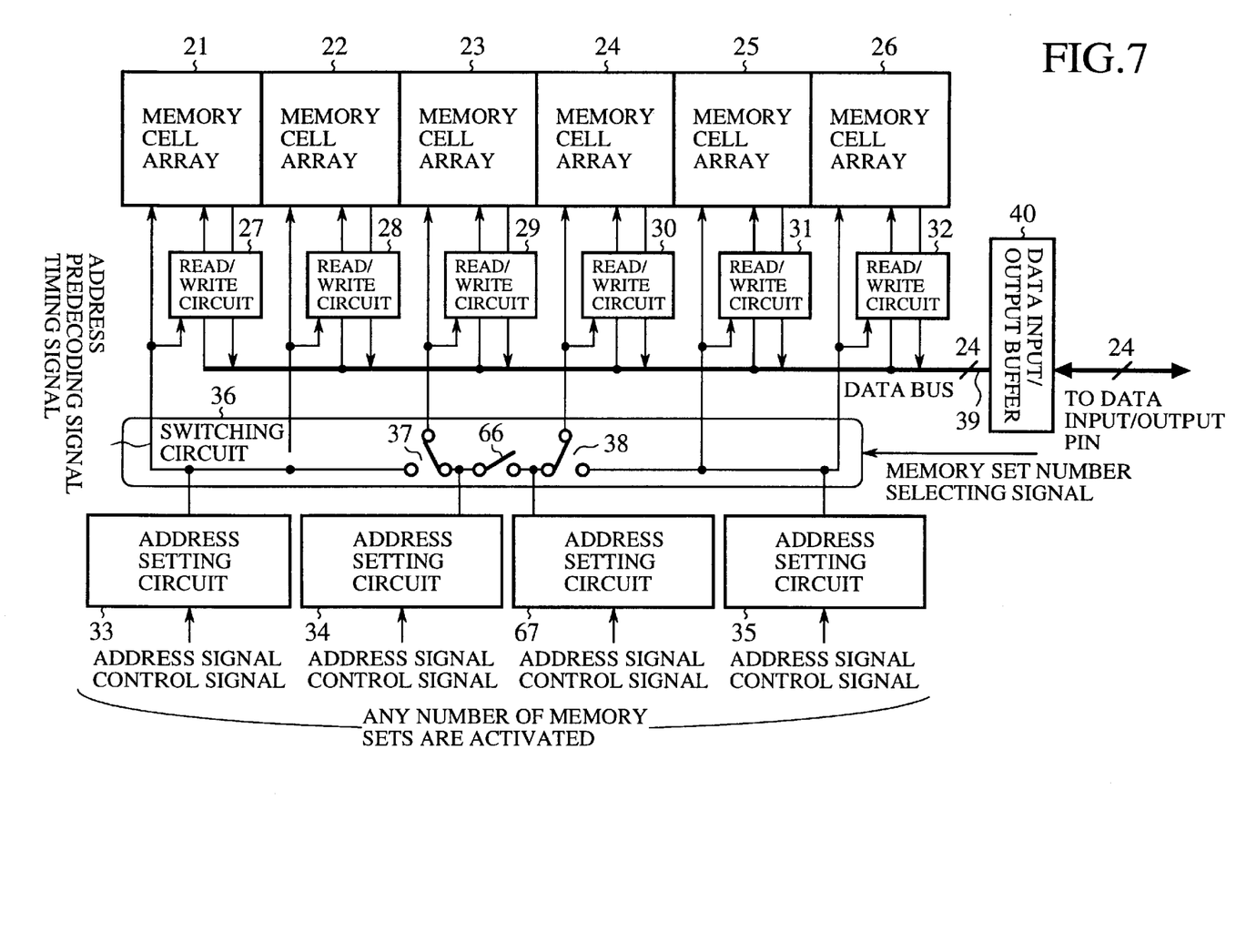
FIG. 7 is a block diagram showing a semiconductor memory device according to the embodiment 5 of the present invention.

FIG. 7 is a block diagram showing a semiconductor memory device according to the embodiment 5 of the present invention. In this figure, like reference numerals of FIG. 1 denote like or corresponding constituent elements thereof and detail explanation therefor is omitted.

The reference numeral 66 designates a switch constituting a switching circuit 36 and the reference numeral 67 designates an address setting circuit.

Next, the operation of the semiconductor memory device will be described.

Although the capacities of the memory sets each are fixed (2 Mbit or 3 Mbit) in the above embodiment 1, they may be changed in the embodiment 5.

Specifically, the switch-on of the switch 66 by the switching circuit 36 results in a construction similar to that of the embodiment 1, while the switch-off of the switch 66 by the switching circuit 36 results in "256K word×8IO×2 sets" and "256K word×4IO×2 sets".

Embodiment 6

Although an input source of memory set number selecting signals is not shown in the above embodiments 1 to 5, a special pad pin for inputting memory set number selecting signals from the outside may be provided.

By using such a special pad pin, the number of memory sets can be selected from the outside, allowing the use of a semiconductor memory device in a plurality of ways.

Further, a special pad for inputting memory set number selecting signals may be provided and be connected to a power supply or ground at the time of bonding.

By using such a special pad, manufacturing can be simplified with reductions in cost.

Further, a signal wiring for inputting memory set number selecting signals may be connected to a power supply or ground in a wafer process.

As a result, the later processes can be simplified.

What is claimed is:

1. A semiconductor memory device-comprising;
   a plurality of memory cell arrays constituting a plurality of memory sets;
   a plurality read/write circuits, connected to the memory cell arrays, respectively, for performing read/write of data for the memory cell arrays;
   a plurality of address setting circuits for setting an address for reading/writing of the read/write circuits, a number of the address setting circuits being a maximum number of the memory sets; and
   switching means for switching a correspondence relationship between the memory cell arrays and the address setting circuits in response to a signal selecting a number of memory sets.

2. A semiconductor memory device as defined in claim 1, further comprising;
   a data input/output buffer for holding data; and
   a data bus controller for controlling a connection relationship between a plurality of data buses connecting the read/write circuits to the data input/output buffer.

3. A semiconductor memory device as defined in claim 1, wherein at a time of switching the correspondence relationship between the memory cell arrays and the address setting circuits, the switching means can disconnect a part of the memory cell arrays from a address setting circuit, if a required memory capacity can be obtained without activating all the memory cell arrays.

4. A semiconductor memory device as defined in claim 3, wherein if a defect occurs in a memory cell array in use, the switching means disconnects the defective memory cell array from an address setting circuit and connects another memory cell array which has been disconnected from the address setting circuit to the address setting circuit.

5. A semiconductor memory device as defined in claim 1, wherein at a time of switching the correspondence relationship between the memory cell arrays and the address setting circuits, the switching means can change a capacity of each of the memory sets composed of at least one memory cell array.

6. A semiconductor memory device as defined in claim 1, further comprising a special pad pin for inputting the signal selecting the number of memory sets from an outside.

7. A semiconductor memory device as defined in claim 1, further comprising a special pad for inputting the signal selecting the number of memory sets, the pad being connected to a power supply or ground at a time of bonding.

8. A semiconductor memory device as defined in claim 1, further comprising a signal wiring for inputting the signal selecting the number of memory sets, the signal wiring being connected to a power supply or ground in a wafer process.

* * * * *